United States Patent [19]

Sheng et al.

[11] Patent Number: 5,106,830
[45] Date of Patent: * Apr. 21, 1992

[54] HIGH TEMPERATURE SUPERCONDUCTOR SYSTEM HAVING THE FORMULA TL-BA-CU-O

[75] Inventors: Zhengzhi Sheng; Allen M. Hermann, both of Fayetteville, Ark.

[73] Assignee: University of Arkansas, Little Rock, Ark.

[*] Notice: The portion of the term of this patent subsequent to Feb. 19, 2008 has been disclaimed.

[21] Appl. No.: 511,237

[22] Filed: Apr. 19, 1990

Related U.S. Application Data

[63] Continuation of Ser. No. 144,114, Jan. 15, 1988, Pat. No. 4,994,432.

[51] Int. Cl.$^5$ .............. C01F 11/02; C01G 3/02; C01G 15/00; H01L 39/12
[52] U.S. Cl. ..................... 505/1; 252/521; 423/604; 423/624; 423/635; 501/123; 505/783
[58] Field of Search .............. 505/783, 1; 252/521; 501/123; 423/604, 624, 635

[56] References Cited

U.S. PATENT DOCUMENTS

| | | | |
|---|---|---|---|
| 4,755,493 | 7/1988 | Takeuchi et al. | 501/134 |
| 4,870,052 | 9/1989 | Engler et al. | 505/1 |
| 4,880,773 | 11/1989 | Itozaki et al. | 505/1 |

FOREIGN PATENT DOCUMENTS

| | | |
|---|---|---|
| 0280812 | 9/1988 | European Pat. Off. |
| 0284062 | 9/1988 | European Pat. Off. |
| 0286289 | 10/1988 | European Pat. Off. |
| 0292340 | 11/1988 | European Pat. Off. |
| 0301952 | 2/1989 | European Pat. Off. |
| 0301958 | 2/1989 | European Pat. Off. |
| 0316009 | 5/1989 | European Pat. Off. |

OTHER PUBLICATIONS

Hasegawa, T. et al., *High $T_c$ Superconductivity of $(La_{1-x}Sr_x)_2CuO_4$-Effect of Substition . . . Superconducitity*, Japan Journal of Applied Physics, vol. 26, No. 4, Apr. 20, 1987, L337-L338.

Kishio, K. et al., *Effect of Lanthanide Ion Substitutions for Lanthanum Sites on Supercondicutivity of $(La_{1-x}Sr_x)_2CuO_{4-\delta}$*, Japanese Journal of Applied Physics, vol. 26, No. 4, Apr. 20, 1987, L391-L393.

Ohshima, S. et al., *Superconducting and Structural Properties of the New $Ba_{1-x}Ln_xCuo_{3-y}$ Compound System (Ln=La, Ce, Pr, Nd, Sm, Eu, . . . and Yb)*, Japanese Journal of Applied Physics, vol. 26, No. 5, May 1987, L815-L817.

Tsurumi, S. et al., *High $T_c$ Superconductivities of $A_2Ba_4Cu_6O_{14+y}$*, Japanese Journal of Applied Physics, vol. 26, No. 5, May 1987, L856-L857.

*Superconductivity News*, vol. 1, No. 2, Aug. 1987, pp. 1, 2, and 6-8.

Yang, K. N. et al., *High Temperature Superconductivity in Rare-Earth (R)-(Barium Copper Oxides (RBa$_2$) Cu$_3$O$_{9-\delta}$*, Solid State Communications, vol. 63, No. 6, 1987, pp. 515-519.

Tarascon, J. M. et al., *Oxygen and Rare-Earth Doping of the 90-K Superconducting Perovskite $YBa_2Cu_3O_{7-x}$*, Physical Review B, vol. 36, No. 1, 1987, 226-234.

Hor, P. H. et al., *Superconductivity Above 90 K in the Square-Planar Compound System $ABa_2Cu_3O_{6+x}$ with A=Y, La, Nd, Sm, Eu, Gd, Ho, Er, and Lu*, Physical Review Letters, vol. 58, No. 18, 1987, 1891-1894.

Khurana, A., *Superconductivity Seen Above the Boiling Point of Nitrogen*, Physics Today, Apr., 1987, 17-23.

(List continued on next page.)

Primary Examiner—Paul Lieberman
Assistant Examiner—John Boyd
Attorney, Agent, or Firm—Hermann Ivester

[57] ABSTRACT

A high temperature superconducting system has the general composition Tl-R-X-Y, wherein: R is a Group 2A element; X is a group 1B element; and Y is a Group 6A element. Preferably, the composition has the following formula Tl-Ba-Cu-O. The high temperature superconductor of the present invention has a transition temperature of about 90 K with the probability of one phase superconducting at a temerature perhaps as high as 270 K. Processes for making the high temperature superconductor are also provided.

1 Claim, 2 Drawing Sheets

OTHER PUBLICATIONS

Cava, R. J., et al., *Bulk Superconductivity at 91 K in Single-Phase Oxygen-Deficient Perovskite $Ba_2YCu_3O_{9-\delta}$*, Physical Review Letters, vol. 58, No. 16, 1987, 1676–1679.

Nagashima, T. et al., *Superconductivity in $Tl_{1.5}SrCaCu_2O_x$*, Japanese Journal of Applied Physics, vol. 27, No. 6, Jun., 1988, L1077–L1079.

Kondoh, S. et al., *Superconductivity in Tl–Ba–Cu–O System*, Solid State Communications, vol. 65, No. 11, 1988, 1329–1331.

Sera. M. et al., *On the structure of High-$T_c$ Oxide System Tl–Ba–Cu–O*, Institute for Molecular Science, Myodaiji, Okazaki 444 Japan, 1988.

Ihara, H. et al., *Possibility of Superconductivity at 65° C. in Sr–Ba–Y–Cu–O System*, Japanese Journal of Applied Physics, vol. 26, No. 8, Aug., 1987, L1413–L1415.

Ishida, T., *Compositional Variation of High $T_c$ in $Yb_xEr_{1-x}Ba_2Cu_3O_{6+y}$ System*, Japanese Journal of Applied Physics, vol. 26, No. 8, Aug., 1987, L1294–L1295.

Kijima, T. et al., *Superconductivity in the Bi–Sr–La–Cu–O System*, Japanese Journal of Applied Physics, vol. 27, No. 6, Jun., 1988, L1035–L1037.

Ferreira, J. M. et al., *Long-range Magnetic Ordering the High-$T_c$ Superconductors $RBa_2Cu_3O_{7-\delta}$ (R=Nd, Sm, Gd, Dy and Er)*, Physical Review B, vol. 37, No. 4, Feb. 1, 1988, 2368–2371.

Shih, I. et al., *Multilayer Deposition of Thallium Barium Calcium Copper Oxide Films*, Applied Physics Letter 53(6), 1988, 523–525.

Ginley, D. S. et al., *Sequential Electron Beam Evaporated Films of $Tl_2CaBa_2Cu_2O_y$ with Zero Resistance at 97 K*, Applied Physics Letters, 53 (5), Aug. 1, 1988, 406–408.

Qiu, C. X. et al., *Formation of Tl–Ca–Ba–Cu–O Films by Diffusion of Tl into rf-sputtered Ca–Ba–Cu–O*, Applied Physics Letters, 53 (12), Sep. 19, 1988, 1122–1124.

Gopalakrishnan, I. K., et al., *Synthesis and Properties of a 125 K Superconductor in the Tl–Ca–Ba–Cu–O System*, Applied Physics Letters, 53 (5), Aug. 1, 1988, 414–416.

Parkin, S. S. P., et al., *Bulk Superconductivity at 125 K in $Tl_2Ca_2Ba_2Cu_3O_x$*, Physical Review, 1988, 2539–2542.

Sheng, Z. Z. et al., *Superconductivity in the Rare-Earth-Free Tl–Ba–Cu–O System Above Liquid-Nitrogen Temperature*, Nature, vol. 332, Mar. 3, 1988, 55–58.

Sheng, Z. Z. et al., *Superconductivity at 90 K in the Tl–Ba–Cu–O System.*, Physical Review Letters, vol. 60, NO. 10, Mar. 7, 1988, 937–940.

Sheng, Z. Z. et al., *Bulk Superconductivity at 120 K in the Tl–Ca/Ba–Cu–O System*, Nature, vol. 332, Mar. 10, 1988, 138–139.

Ihara, H., et al., *A New High-$T_c$ $TlBa_2Ca_3Cu_4O_{11}$ Superconductor with $T_c>120$ K*, Nature, vol. 344 Aug. 11, 1988, 510–511.

Sheng, Z. Z. et al. *$Tl_2O_3$ Vapor Process of Making Tl–Ba–Ca–Cu–O Superconductors*, Appl. Phys. Lett. 53 (26) Dec. 26, 1988, 2686–2688.

Hazen, R. M., et al., *100-K Superconducting Phases in the Tl–Ca–Ba–Cu–O System*, Physical Review Letters, vol. 60, No, 16, Apr. 18, 1988, 1657–1660.

Sheng, Z. Z., et al., *New 120 K Tl–Ca–Ba–Cu–O Superconductor*, Appl. Phys. Lett., vol. 52, No. 20, May 16, 1988, 1738–1740.

Lin, R. J., et al., *Forming Superconducting Tl–Ca–Ba–Cu–O Thin Films by the Diffusion Method*, Japanese Journal of Applied Physics, vol. 28, No. 1, Jan., 1989, L85–L87.

Thompson, B. J., et al., *Preparation of High $T_c$ Tl–Ba–Ca–Cu–O Thin Films by Pulsed Laser Evaporation and $Tl_2O_3$ Vapor Processing*, Appl. Phys. Lett. 54(18), May 1, 1989, 1810–1811.

Sugise, R., et al., *Preparation of $Tl_2Ba_2Ca_2Cu_3O_y$ Thick Films from Ba–Ca–Cu–O Films*, Japanese Journal of Applied Physics, vol. 27, No. 12, Dec., 1988, L2314–L2316.

Hatta, S. et al., *Pt-Coated Substrate Effect on Oxide Superconductive Films in Low-Temperature Processing*, Appl. Phys. Lett. 53 (2), Jul. 11, 1988, 148–150.

Lee, W. Y. et al., *Superconducting Tl–Ca–Ba–Cu–O Thin Films with Zero Resistance at Tempratures of Up to 120 K*, Appl. Phys. Lett. 53 (4), July 25, 1988, 329–331.

Oota, A. et al., *Electrical, Magnetic and Superconducting Properties of High-$T_c$ Superconductor (Y, Sc)–(Ba, Sr)–Cu Oxide*, Japanese Journal of Appl. Physics, vol. 26, No. 8, Aug., 1987, L1356–1358.

Iwazumi, T. et al. *Identification of a Structure with Two Superconducting Phases in L–Ba–Cu–O System (L=La or Y)*, Japanese Journal of Applied Physics, vol. 26, No. 5, May 1987, L621–L632.

Capone, II., D. W., et al., *Super Critical Fields and High Superconducting Transition Temperatures of $La_{1.85}Sr_{0.15}CuO_4$ and $La_{1.85}Ba_{0.15}CuO_4$*, Appl. Phys. Lett 50 (9), Mar. 2, 1987, 543–544.

Johnson, D. W., et al., *Fabrication of Ceramic Articles from High $T_c$ Superconducting Oxides*, Matrials Research Society, Symposium S Proceedings (High Temperature Superconductors), Apr. 1987, 193–195.

Garwin, L. *Superconducting Conference Yields New Temperature Record*, Nature vol. 332 Mar. 10, 1988.

Suzuki, A., et al., *Rare-Earth (RE)–Barium Solubility Behavior in $Y(Ba_{z-x}RE_x) Cu_3O_{7+\delta}$ and $Sm (Ba_{z-x}RE_x) Cu_3O_{7+\delta}$*, Japanese Journal of Applied Physics, vol. 27, No. 5, May, 1988, L792–L794.

Nagashima, T. et al., *Improving Superconducting Characteristics of Tl–Sr–Ca–Cu–O by Doping with Pb and/or Rare-Earth Elements*, Japanese Journal of Applied Physics, vol. 28, No. 6, Jun. 1989, L930–L933.

Vijayaraghavan R., et al., *Investigation of Novel Cuprates of the $TlCa_{1-x}Ln_xSr_2Cu_2O_{7-\delta}$ (Ln=rare earth) Series Showing Electron-or Hole-Superconducitivity Depending on the Composition*, Superconducting Science and Technology, vol. 2(3), Sep. 1989, 195–201.

Inoue, O. et al., *Superconductivity in a Tl–Sr–Y–Cu–O System*, Japanese Journal of Applied Physics, vol. 28, No. 8, Aug. 1989, L1375–L1377.

Peters, P. N. et al., *Observation of Enhanced Properties in Samples of Silver Oxide Doped $YBa_2Cu_3O_x$*, Appl. Phys. Lett 52 (24), Jun. 13, 1988, 2066–2067.

S. Natarajan et al., *Superconductivity Stuides on $(Y_{1-x}Ln_x) Ba_2Cu_3O_7$, Ln=La, Pr, Tb*, Physica C, vol. 153–155, Feb. 1988, 926–927.

D. D. Sarma, et al., *Electronic Structure of High-$T_c$ Superconductors from Soft-X-Ray Absorption*, Physical Review B, vol. 37, No. 16, Jun. 1988, 9784–9787.

(List continued on next page.)

OTHER PUBLICATIONS

K. Kishio, et al., *Superconductivity Achieved at Over Liquid Nitrogen Temperature by (Mixed Rare Earths)-Ba-Cu Oxides*, Japanese Journal of Applied Physics, vol. 26, No. 5, May 1987, L694–L696.

Waldrop, M. Mitchell, *Thallium Superconductor Reaches 125 K*, Research News, Mar. 1988, 1243.

Qadri, S. B. et al., *X-Ray Identification of the Superconducting High-$T_c$ Phase in the Y-Ba-Cu-O System*, Physical Review B, vol. 35, No. 13, 1987.

Murphy, D. W. et al., *New Superconducting Cuprate Perovskites*, Physical Review Letters, vol. 58, May 1987, 1888–1890.

Saito "High-$T_c$ Superconducting Properties in . . . ", *Physica 148 B (1987)*.

Richert "Atomic Substitution in $YBa_2Cu_3O_x$ . . . ", *Amer. Vac. Soc. Ser. 3* Nov. 6, 1987 Anaheim Calif. p. 277–282.

HIGH TEMPERATURE SUPERCONDUCTOR SYSTEM HAVING THE FORMULA TL-BA-CU-O

This is a continuation of application Ser. No. 144,114, filed Jan. 15, 1988 now U.S. Pat. No. 4,994,432 issued 2/19/91.

BACKGROUND OF THE INVENTION

The present invention relates to high temperature superconductors and methods of making same.

Recently, there has been much work done on the utilization of ternary oxides containing rare earth elements, barium, and copper for superconductivity above the temperature of liquid nitrogen. To date, these systems typically require four elements: a rare earth; an alkaline earth; copper; and oxygen. Superconductor systems based on rare earth elements have not been entirely satisfactory. The use of rare earth elements in the production of superconductors increases the cost of the resultant superconductors because these rare earth elements are in relatively short supply and are expensive. Furthermore, these systems typically exhibit limited transition temperatures at or below 93 K. Partial substitutions of elements for the member(s) in these systems have not produced significantly higher temperature superconductors.

Typical high temperature superconductive systems based on rare earth elements also suffer the disadvantage of not being producible in an expedient manner. Therefore, typical methods for producing these high temperature superconductive systems do not provide low cost processing and manufacturability.

Accordingly, there is a need for a new superconductive system and process for making same.

SUMMARY OF THE INVENTION

The present invention provides a new high temperature superconductive system and method of making same.

The new high temperature superconductive system is free of rare earth elements and is unique to date among high temperature superconductive systems. To this end, the present invention provides a high temperature superconductive system containing thallium (Tl) and having the following general formula:

Tl-R-X-Y wherein:
R is a metallic element;
X is a metallic element; and
Y is a non-metallic element.

Preferably: R is an element chosen from Group 2A; X is an element chosen from Group 1B; and Y is an element chosen from Group 6A.

In a preferred embodiment, R is barium (Ba), X is copper (Cu), and Y is oxygen (O).

In a preferred embodiment, the superconductor of the new superconductive system of the present invention has the following approximate stoichiometry:

$TlBa_aCu_bO_c$ wherein:
a is greater than 0.2 and less than 5;
b is greater than 0.5 and less than 15; and
c is greater than a+b and less than 2+a+b.

A method of producing the high temperature superconductor of the present invention is also provided. The method of the present invention allows the superconductor to be prepared at temperatures of approximately 850° to about 950° C. in flowing oxygen. Accordingly, the method of the present invention allows the superconductor to be formed at relatively low temperatures. Furthermore, the method of the present invention allows the superconductor to be produced rapidly, in approximately 30 minutes.

Additional advantages and features of the present invention are described in, and will be apparent from, the detailed description of the presently preferred embodiments and from the drawings.

DETAILED DESCRIPTION OF THE PRESENTLY PREFERRED EMBODIMENTS

Figure 1:
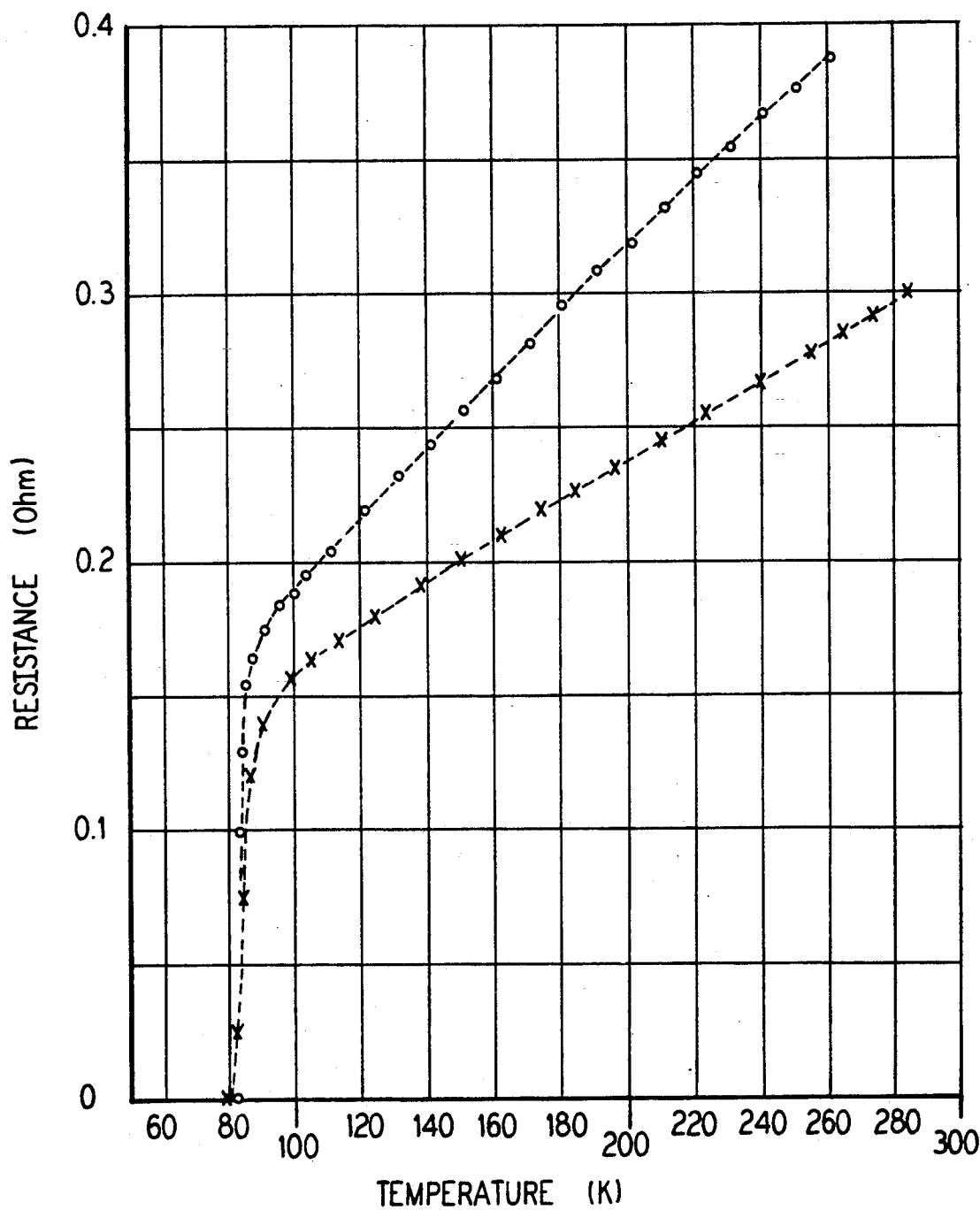
FIG. 1 illustrates variations in the electrical resistance vis-a-vis temperature of two Tl-Ba-Cu-O superconductor samples constructed in accordance with the present invention.

The present invention provides a ne high temperature superconductor and method of making same. As used herein, the term "high temperature" refers to a temperature above the boiling point of liquid nitrogen. The present invention also provides a new superconductive system that may produce higher temperature, even room temperature, superconductors by further elemental substitution and variation of preparation procedures As set forth in the background of the invention, the high temperature superconductors that have been proposed to date require four elements: a rare earth; an alkaline earth; copper; and oxygen. The inventors of the present invention have discovered a superconductive system that does not require the presence of a rare earth element. To this end, the present invention provides a superconductive system based on thallium (Tl). The superconductor constructed in accordance with the present invention is superconducting with a critical temperature of at least 85 K. with indications of smaller superconductive phase at 270 K. Furthermore, the inventors have found that the new high temperature superconductor can be rapidly produced at relatively low temperatures.

The superconductor system of the present invention has the following general formula:

Tl-R-X-Y wherein:
R is a metallic element;
X is another metallic element; and
Y is a non-metallic element.

Preferably, R is an element chosen from Group 2A, X is an element chosen from Group 1B, and Y is an element chosen from Group 6A.

In a preferred embodiment, R is barium (Ba), X is copper (Cu), and Y is oxygen (O).

In a preferred embodiment, a superconductor constructed from the new superconductive system of the present invention has the following approximate stoichiometry:

$TlBa_aCu_bO_c$ wherein:

a is greater than 0.2 and less than 5;

b is greater than 0.5 and less than 15; and c is greater than a+b and less than 2+a+b.

By way of example and not limitation, examples of the new high temperature Tl-Ba-Cu-O superconductor of the present invention, and method of making same, will now be given.

EXAMPLE 1

A. The following reagents were utilized:
1. $Tl_2O_3$,
2. $BaCO_3$,
3. CuO.

B. The following procedure was followed:

1. A mixture of a one molar portion of $BaCO_3$ and a three molar portion of CuO was ground with an agate mortar and pestle, heated in air at approximately 925° C. for more than 24 hours (with several intermediate grindings) to obtain a uniform black powder having the nominal formula $BaCu_3O_4$.

2. The resulting $BaCu_3O_4$ powder was mixed with $Tl_2O_3$ to a molar ratio of 1:0.5. The mixture was completely ground and then pressed into a pellet.

3. A tube furnace was heated to a temperature of approximately 880° to about 900° C. in flowing oxygen.

4. The pellet was then placed in the tube furnace for 2-5 minutes while the temperature and oxygen flow were maintained.

5. After the pellet was slightly melted it was taken out of the furnace and quenched in air until it reached room temperature By visual inspection, it was determined that the $Tl_2O_3$ had been partially volatilized as black smoke, part had become a light yellow liquid, and part had reacted with the Ba-Cu oxide to form a partially melted black porous material which is multiphase and superconductive. The samples prepared by this procedure had an onset temperature of about 96 K., a midpoint of about 85 K., and a zero resistance temperature of about 81 K.

FIG. 1 illustrates resistance versus temperature dependences down to the boiling point of liquid nitrogen (77 K.) for two samples made pursuant to the procedure of this example. The samples were measured in a simple liquid nitrogen Dewar. Quantitative magnetic examinations of Meissner effect flux expulsion confirmed that the sharp drop of resistance originated from the superconductivity of these samples.

EXAMPLE 2

A. The following reagents were utilized:
1. $Tl_2O_3$,
2. $BaCO_3$,
3. CuO.

B. The following procedure was followed:

1. A mixture of a one molar portion of $BaCO_3$ and a three molar portion of CuO was ground with an agate mortar and pestle. The ground mixture was heated in air at approximately 925° C. for more than 24 hours with several intermediate grindings to obtain a uniform black powder having a nominal composition $BaCu_3O_4$.

2. The resulting $BaCu_3O_4$ powder was mixed with $Tl_2O_3$ in a molar ratio of 1:1, completely ground, and pressed into a pellet.

3. A tube furnace was heated to approximately 950° C. in flowing oxygen.

4. The pellet was then placed in the tube furnace for 2-5 minutes while maintaining the temperature and oxygen flow.

5. After the pellet had completely melted, it was taken out of the furnace and quenched in air until it reached room temperature.

Figure 2:
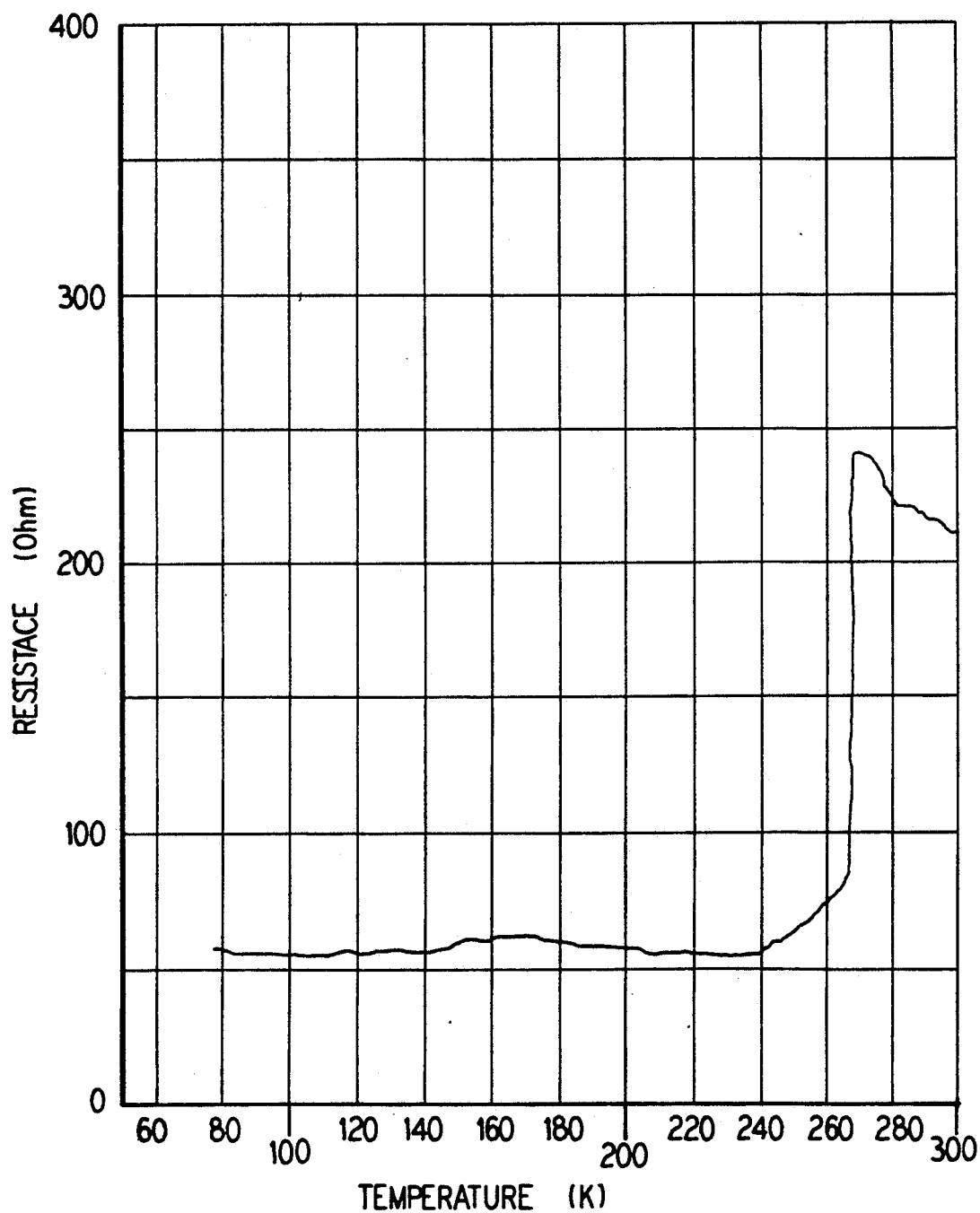
FIG. 2 illustrates the electrical resistance vis-a-vis temperature of a Tl-Ba-Cu-O sample constructed in accordance with the present invention.

The melted sample had visible crystalline grains. FIG. 2 illustrates the electrical resistance versus temperature for a superconductor constructed pursuant to this example. As illustrated, resistance-temperature dependence showed a sharp drop of resistance at about 270 K., which suggests a very high temperature superconducting phase in this sample.

EXAMPLE 3

A. The following reagents were utilized:
1. $Tl_2O_3$,
2. $BaCO_3$,
3. CuO.

B. The following procedure was followed:

A mixture of a two molar portion of $BaCO_3$ and a three molar portion of CuO was ground with an agate mortar and pestle, heated in air at approximately 925° C. for more than 24 hours (with several intermediate grindings) to obtain a uniform black powder having the nominal composition $Ba_2Cu_3O_5$.

2. The resultant $Ba_2Cu_3O_5$ powder was mixed with $Tl_2O_3$ to a molar ratio of 1:0.75, completely ground, and pressed into a pellet.

3. A tube furnace was heated to a temperature of approximately 880° to about 900° C. in flowing oxygen.

4. The pellet was placed in the tube furnace for 2-5 minutes while maintaining the temperature and oxygen flow.

5. After the pellet had slightly melted it was taken out of the furnace and quenched in air until it reached room temperature.

The samples prepared by this procedure have been found to be superconductive and have an onset temperature of about 96 K., a midpoint of about 85 K., and a zero resistance temperature of about 81 K.

EXAMPLE 4

A. The following reagents were utilized:
1. $Tl_2O_3$,
2. $BaCO_3$,
3. CuO.

B. The following procedure was followed:

1. Appropriate amounts of $Tl_2O_3$, $BaCO_3$ and CuO with a nominal composition of $TlBaCu_3O_{5.5+x}$ were mixed and ground, and pressed into a pellet.

2. A tube furnace was heated to a temperature of approximately 900° to about 950° C. in flowing oxygen.

3. The pellet was placed in the tube furnace for 2-5 minutes while the temperature and oxygen flow were maintained.

4. After the pellet had slightly melted, the pellet was taken out from the furnace and was quenched in air to room temperature.

The heated partially melted sample exhibited superconductive properties. The onset temperature (sharp resistance decrease) for this sample was about 90 K.

EXAMPLE 5

A. The following reagents were utilized:
1. $Tl_2O_3$,
2. $BaCO_3$,
3. CuO.

B. The same procedure was followed as set forth in Example 4 above except that the nominal composition of the sample was $Tl_{0.5}BaCu_3O_{4.8+x}$. The heated (partially melted) sample was superconductive. The onset temperature (sharp resistance decrease) for this sample was about 90 K.

EXAMPLE 6

A. The following reagents were utilized:
1. $Tl_2O_3$,
2. $BaCO_3$,
3. CuO.

B. The same procedure was followed as set forth in Example 4 above except that the nominal composition of the sample was $Tl_2BaCu_3O_{7+x}$. The heated (partially melted) sample was superconductive. The onset temperature (sharp resistance decrease) for this sample was about 90 K.

EXAMPLE 7

A. The following reagents were utilized:
1. $Tl_2O_3$,
2. $BaCO_3$,
3. CuO. B. The same procedure was followed as set forth in Example 4 above except that the nominal composition of the sample was $Tl_5BaCu_3O_{11.5+x}$. The heated (partially melted) sample was superconductive. The onset temperature (sharp resistance decrease) for this sample was about 90 K.

EXAMPLE 8

A. The following reagents were utilized:
1. $Tl_2O_3$,
2. $BaCO_3$,
3. CuO.

B. The same procedure was followed as set forth in Example 4 above except that the nominal composition of the sample was $TlBa_2Cu_3O_{6.5+x}$. The heated sample had partially melted and was superconductive. The onset temperature (sharp resistance decrease) for this sample was about 90 K.

EXAMPLE 9

A. The following reagents were utilized:
1. $Tl_2O_3$,
2. $BaCO_3$,
3. CuO.

B. The following procedure was followed:
1. A mixture of a one molar portion of $BaCO_3$ and a three molar portion of CuO was ground with an agate mortar and pestle, then heated in air at approximately 925° C. for 2 hours, and reground.

2. The resulting $BaCu_3O_4$ powder was put into a quartz boat, and lightly pressed with an agate pestle.

3. $Tl_2O_3$ crystalline powder having approximately half the weight of the $BaCu_3O_4$ powder was put on the $BaCu_3O_4$, and heated in a tube furnace in air at a temperature of approximately 900° to about 950° C. for about 30 minutes.

4. After almost all of the $Tl_2O_3$ had disappeared (by being volatized, melted and/or reacted), the heated sample was taken from the furnace and quenched in air to room temperature.

By visual inspection, it was determined that the $Tl_2O_3$ had partially volatilized as black smoke, part of the $Tl_2O_3$ had become a light yellow liquid, and part had reacted with Ba-Cu oxide to form a black porous material which is multiphase and superconductive. This superconductor material had a transition temperature of 78 K. (the transition temperature specified here represents the midpoint of the 90% resistance and 10% resistance points in the transition region).

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such change and modifications be covered by the appended claims.

We claim:
1. A high temperature superconductor having the following formula Tl-Ba-Cu-O.

* * * * *